United States Patent
Iwabuchi et al.

(10) Patent No.: US 9,293,570 B2
(45) Date of Patent: Mar. 22, 2016

(54) SEMICONDUCTOR DEVICE, ELECTRIC CIRCUIT USING THE SAME AND METHOD OF CONTROLLING ELECTRIC CIRCUIT

(75) Inventors: Akio Iwabuchi, Niiza (JP); Hironori Aoki, Niiza (JP)

(73) Assignee: SANKEN ELECTRIC CO., LTD., Niiza-Shi, Saitama (JP)

( * ) Notice: Subject to any disclaimer, the term of this patent is extended or adjusted under 35 U.S.C. 154(b) by 224 days.

(21) Appl. No.: 13/223,986

(22) Filed: Sep. 1, 2011

(65) Prior Publication Data

US 2012/0056648 A1    Mar. 8, 2012

(30) Foreign Application Priority Data

Sep. 2, 2010 (JP) .................... 2010-196461

(51) Int. Cl.
| | |
|---|---|
| H01L 29/66 | (2006.01) |
| H01L 29/778 | (2006.01) |
| H01L 27/06 | (2006.01) |
| H03K 17/082 | (2006.01) |
| H01L 29/20 | (2006.01) |

(52) U.S. Cl.
CPC ........ *H01L 29/7787* (2013.01); *H01L 27/0605* (2013.01); *H03K 17/0822* (2013.01); *H01L 29/2003* (2013.01); *H01L 2924/0002* (2013.01)

(58) Field of Classification Search
CPC ........... H03K 17/0822; H01L 27/0605; H01L 29/7787
USPC ...................... 257/194, 48, E23.179
See application file for complete search history.

(56) References Cited

U.S. PATENT DOCUMENTS

| | | | |
|---|---|---|---|
| 7,288,803 B2 | 10/2007 | Beach et al. | |
| 2005/0189561 A1* | 9/2005 | Kinzer | H01L 27/0605 257/192 |
| 2007/0045765 A1* | 3/2007 | Brar | H01L 27/0605 257/481 |
| 2007/0102727 A1* | 5/2007 | Twynam | H01L 29/402 257/194 |
| 2009/0101817 A1* | 4/2009 | Ohshima | H01J 37/244 250/310 |
| 2010/0206366 A1* | 8/2010 | English | H01L 31/02021 136/255 |
| 2011/0210377 A1* | 9/2011 | Haeberlen et al. | 257/194 |

FOREIGN PATENT DOCUMENTS

| | | |
|---|---|---|
| JP | 2006-108679 A | 4/2006 |
| JP | 2006-115557 A | 4/2006 |

* cited by examiner

*Primary Examiner* — Vongsavanh Sengdara
(74) *Attorney, Agent, or Firm* — Birch, Stewart, Kolasch & Birch, LLP

(57) ABSTRACT

The operation of a HEMT is monitored on an on-chip basis without increasing the power consumption rate. In a semiconductor device 10, an electron supply layer 12 is formed on a channel layer 11. A two-dimensional electron gas (2DEG) layer 13 is formed at the side of the channel layer of the hetero-junction interface. Electrons flow through the 2DEG layer 13 between a source electrode 14 formed on the surface of the electron supply layer 12 and a drain electrode 15 that is formed on the same surface. A potential detection electrode 17 is arranged on the electron supply layer 12 between the gate electrode 16 and the source electrode 14. A resistor 18 having a sufficiently high resistance value makes the electric current flowing to the potential detection electrode 17 negligible relative to the drain current in operation.

8 Claims, 5 Drawing Sheets

SEMICONDUCTOR DEVICE, ELECTRIC CIRCUIT USING THE SAME AND METHOD OF CONTROLLING ELECTRIC CIRCUIT

BACKGROUND OF THE INVENTION

1. Field of the Invention

The present invention relates to a semiconductor device designed to operate by using two-dimensional electron gas as channel, an electric circuit using such a semiconductor device and a method of controlling such an electric circuit.

2. Description of the Related Art

HEMT (high electron mobility transistor) is known as typical semiconductor device that employs two-dimensional electron gas (2DEG) as channel for operation. In a HEMT, 2DEG is formed along the interface of a channel layer (non-doped GaN, for example) and an electron supply layer (AlGaN, for example) at the side of the channel layer. A channel is formed in the 2DEG between the source and the drain of the transistor and turned on and off by the gate of the transistor for switching operations.

Particularly, GaN-based HEMT, where GaN is a nitride semiconductor, is suited for switching operations for high power because the bandgap of GaN is large and the electron saturation velocity is high. Therefore, a switching circuit that operates with high power can be formed by using GaN-based HEMT. FIG. 6 illustrates an exemplar full bridge circuit (electric circuit) for driving a motor formed by using four HEMTs as switching devices. With the illustrated circuit configuration, two arms, each having two switching devices connected in series between a high side terminal and a low side terminal are formed in juxtaposition. The connection point of the two switching devices of one of the arms and that of the two switching devices of the other arm are respectively denoted by A and B and the opposite terminals of coil L for driving a motor are connected to them. The direction in which an electric current flows through the coil L is controlled by switching the high side transistors (Tr1, Tr2) and the low side transistors (Tr3, Tr4). For example, an electric current flows by way of the route indicated by an arrowed broken line in FIG. 6 when Tr1 and Tr4 are turned on while Tr2 and Tr3 are turned off. An electric current flows in the opposite direction when Tr1 and Tr4 are turned off while Tr2 and Tr3 are turned on. In this way, the sense of rotation and stop of a motor can be controlled by controlling each of the transistors Tr1 through Tr4 for on and off. Particularly, such a circuit can be used for controlling high power at high speed when HEMTs are used as Tr1 through Tr4.

When transistors are employed to operate for high power, monitoring the operations of the transistors is an effective for security. For example, the electric current flowing through Tr1 may be monitored before Tr4 is turned on, to determine whether Tr4 can be turned on properly by the monitored electric current value. With such an arrangement, a motor will be safely operated. Patent Document 1 (Jpn. Pat. Appln. Laid-Open Publication No. 2006-108679) describes such a current detection type HEMT. With the technique described in Patent Document 1, a plurality of sets of a source electrode, a gate electrode and a drain electrode of HEMT are arranged in array and an electrode region for current detection is formed at the outside. The electrode region operates as pseudo source electrode and the drain current flowing to HEMT can be monitored by observing the electric current flowing to the electrode region.

HEMT that can detect an excess current is obtained by using this technique. Then, a switching circuit that operates safely with high power is obtained by using such HEMT.

However, when detecting an electric current by means of a current detection device, electric power is consumed in this current detection device in addition to the power consumed for the intrinsic operation of HEMT. It has been difficult to monitor the operation of HEMT in an on-chip manner without an increase of power consumption.

SUMMARY OF THE INVENTION

In view of the above-identified problem, it is therefore an object of the present invention to dissolve the problem.

According to the present invention, the above problem is dissolved by the configuration described below.

According to an aspect of the present invention, there is provided a semiconductor device which includes a first semiconductor layer, a second semiconductor layer formed on the first semiconductor layer, and a source electrode, a drain electrode and a gate electrode formed on the second semiconductor layer, and in which electrons flow between the source electrode and the drain electrode by way of a two-dimensional electron gas layer at the hetero-junction interface of the first semiconductor layer and the second semiconductor layer and a channel where the electrons flow is controlled for on and off by a voltage applied to the gate electrode. In the semiconductor device, a potential detection electrode is formed on the second semiconductor layer on the channel between the source electrode and the gate electrode.

In the semiconductor device according to the present invention, a resistor having a resistance value of not less than 1 MΩ is connected to the potential detection electrode.

In the semiconductor device according to the present invention, the potential detection electrode is formed by a material adapted to ohmic contact with the second semiconductor layer.

In the semiconductor device according to the present invention, the potential detection electrode is formed by a material adapted to Schottky contact with the second semiconductor layer.

In the semiconductor device according to the present invention, the first semiconductor layer and the second semiconductor layer are formed respectively by nitride semiconductors.

According to another aspect of the present invention, there is provided an electric circuit which includes more than one arms, each being formed by connecting two switching devices in series between the high side terminal and the low side terminal thereof, and in which the opposite terminals of a coil are connected to the connection points of the two switching devices of the arms. In the electric circuit, the semiconductor device is employed as at least the switching device arranged at the low side.

According to another aspect of the present invention, there is provided an electric circuit which includes more than one arms, each being formed by connecting two switching devices in series between the high side terminal and the low side terminal thereof, and in which the opposite terminals of a coil are connected to the connection points of the two switching devices of the arms. In the electric circuit, the semiconductor device is arranged in each of the arms with the drain electrode of the semiconductor device connected to the connection point.

According to still another aspect of the present invention, there is provided a method of controlling an electric circuit having the semiconductor device. The method includes a first step of controlling a voltage applied to the gate electrode to turn on the semiconductor device in the case where the potential detected by the potential detection electrode is negative when the semiconductor device is off.

The method of controlling an electric circuit as defined above further includes a second step of turning off the semiconductor device after the first step when the absolute value of the potential detected by the potential detection electrode becomes smaller than a predetermined value.

Thus, according to the present invention, the operation of a HEMT can be monitored on an on-chip basis without increasing the power consumption rate. Thus, an electric circuit can be operated optimally by using the configuration according to the present invention.

DETAILED DESCRIPTION OF THE PREFERRED EMBODIMENTS

A semiconductor device according to the present invention can find preferable applications in the field of switching devices that operate with highpower. The semiconductor device is a so-called HEMT (high electron mobility transistor) in which a second semiconductor layer is formed on a first semiconductor layer and a channel of two-dimensional electron gas (2DEG) is formed along the hetero-junction interface of them and controlled for on and off by a voltage applied to the gate electrode of the semiconductor device. The operation of the device can be monitored particularly in terms of the potential between the main electrodes thereof.

Figure 1A:
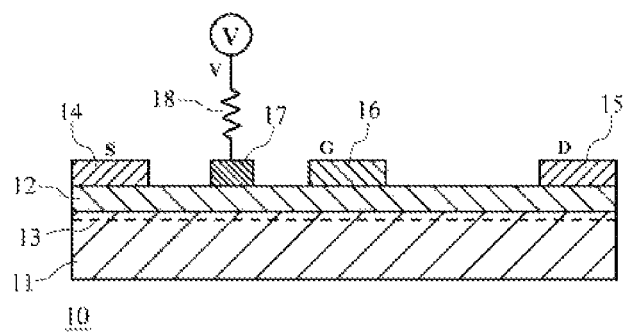
FIG. 1A is a schematic cross-sectional view of a semiconductor device according to an embodiment of the present invention and FIG. 1B is an equivalent circuit diagram thereof.
Figure 1B:
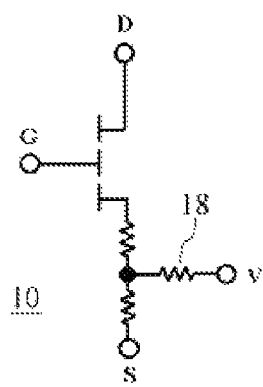

FIG. 1A is a schematic cross-sectional view of the semiconductor device according to the present invention, illustrating the structure thereof. FIG. 1B is an equivalent circuit diagram of the device of FIG. 1A.

As seen from FIG. 1A, an electron supply layer 12, which is the second semiconductor layer, is formed on a channel layer 11, which is the first semiconductor layer, in the semiconductor device 10. A two-dimensional electron gas (2DEG) layer 13 is formed along the interface (hetero-junction interface) thereof at the side of the channel layer. The 2DEG is formed by utilizing the discontinuity of the band structure of the hetero-junction interface or piezoelectric polarization particularly when the channel layer 11 is made of GaN. In the semiconductor device 10, electrons flows through the 2DEG layer 13 between a source electrode 14, which is the first main electrode formed on the surface of electron supply layer 12, and a drain electrode 15, which is the second main electrode formed also on the same surface. A gate electrode 16 is formed on the surface of the electron supply layer 12 between the source electrode 14 and the drain electrode 15. A channel is formed in the 2DEG layer 13 between the source electrode 14 and the drain electrode 15. The channel is controlled for on and off by the gate electrode 14 for switching operations. The channel layer 11 is formed on a substrate, which is omitted in FIG. 1. The above-described arrangement is same as that of any known HEMT. When the semiconductor device 10 is put to use, the source electrode 14 becomes a grounded side, whereas the drain electrode 15 becomes a positive high voltage side and the channel between the source electrode 14 and the drain electrode 15 is turned on and off for conduction by a voltage applied to the gate electrode 16.

In the semiconductor device 10, a potential detection electrode 17 is arranged on the electron supply layer 12 between the gate electrode 16 and the source electrode 14. A resistor 18 is connected to the potential detection electrode 17. In operation, the resistor 18 shows a sufficiently high resistance value (e.g., not lower than 1 MΩ) that makes the electric current flowing to the potential detection electrode 17 negligible relative to the drain current.

As shown in FIG. 1B, with the above-described arrangement, the potential detected by the potential detection electrode 17 corresponds to the resistance-divided channel potential between immediately downstream of the gate electrode 16 and the source electrode 14. Thus, the channel potential of this part can be detected by the potential detection electrode 17.

The channel layer (the first semiconductor layer) 11 is a non-doped monocrystalline GaN layer that is typically formed on a silicon substrate by epitaxial growth. The thickness of the layer 11 is typically between about 0.5 μm and 10 μm. The channel layer 11 may be formed by epitaxial growth not directly on a substrate but with a buffer layer interposed between the layer 11 and the substrate. For example, the channel layer 11 can be formed on a substrate by MOCVD (metal organic chemical vapor deposition).

The electron supply layer (the second semiconductor layer) 12 is made of mixed crystal, which may be $Al_xGa_{1-x}N$ (x=0.1 to 0.4) for example. The thickness of the layer 12 is typically between about 5 nm and 50 nm. The lattice constant of AlGaN is smaller than that of GaN and its electron concentration is higher than that of the latter. It is well known that, with such a structure, electrons are accumulated at the side of the channel layer 11 of the interface of the channel layer 11 and the electron supply layer 12 due to the synergetic effect of piezoelectric polarization and spontaneous polarization to form a two-dimensional electron gas (2DEG) layer 13. Since no impurity that can scatter electrons is found at the side of the channel layer 11, the electron mobility can be raised to a very high level. The electron supply layer 12 can be formed also by MOCVD on the channel layer 11. As both the channel layer 11 and the electron supply layer 12 are made of respective nitride semiconductors having a wide bandgap, the semiconductor device 10 can operate with high power and hence a large electric current can be made to flow between the source electrode 14 and the drain electrode 15 that are main electrodes.

The source electrode 14 and the drain electrode 15 are typically made of Ti/Al or the like as metal adapted to ohmic contact with the electron supply layer 12. Then, as a result, electrons flow between the source electrode 14 and the drain electrode 15 by way of the 2DEG layer 13. The gate electrode 16 is made of a material that is adapted to Schottky contact with the electron supply layer 12 to form a depletion layer in the electron supply layer 12. Particularly, a p-type metal oxide semiconductor (such as NiO$_x$) adapted to Schottky contact with the electron supply layer 12 is preferably employed for the gate electrode 16 in order to hold the semiconductor device 10 (HEMT) in a normally-off state in operation with a positive voltage for the gate threshold value. Then, a laminated structure of a p-type metal oxide semiconductor and metal can be used. Generally, Schottky contact is a form of contact between semiconductor and metal that is contrastive to ohmic contact that is devoid of any rectifying characteristic when an electric current flows. For the purpose of the present invention, the contact between the gate electrode 16 (made of a p-type metal oxide semiconductor, for example) and the semiconductor (of the electron supply layer 12), namely between two different semiconductors, is also referred to as Schottky contact in a wide sense of the words when it provides an effect similar to that of the Schottky contact between metal and semiconductor. The expression of a similar effect as used herein refers to an effect of forming a depletion layer at the interface of the gate electrode 16 and the electron supply layer 12 when no bias is applied to the gate electrode 16. With this arrangement, the semiconductor device 10 (HEMT) operates as a normally-off type device.

A metal material or the like that is adapted to ohmic contact with the electron supply layer 12 may be used to form the electric potential detection electrode 17 like the source electrode 14 and the drain electrode 15. Alternatively, a material that is adapted to Schottky contact with the electron supply layer 12 may be used to form the potential detection electrode 17 like the gate electrode 16. The resistor 18 may be connected as a component separate from the semiconductor layers (the channel layer 11, the electron supply layer 12 and so on). Alternatively, the resistor 18 may be formed on the semiconductor layers by way of an insulating layer and connected by means of a wire.

When operating the semiconductor device 10, the source electrode 14 is grounded and a positive high voltage (e.g., 500 V) is applied to the drain electrode 15. In an instance where the semiconductor device 10 is a normally-off type device, an operation current (drain current) flows between the source electrode 14 and the drain electrode 15 when a positive voltage that is higher than a threshold value is applied to the gate electrode 16. In other words, the drain current can be controlled for on and off by controlling the gate voltage. This operation is same as that of any known HEMT.

At this time, the potential of the potential detection electrode 17 reflects the channel potential immediately downstream of the potential detection electrode 17 in operation. Therefore, the potential detection electrode 17 shows a high potential when the semiconductor device 10 is off, whereas it shows a low potential when the semiconductor device 10 is on. In case where the drain electrode 15 side shows a negative potential, the channel potential detected there also becomes negative so that the polarity thereof can also be detected. In other words, how the semiconductor device 10 is operating can be monitored by observing the potential and the polarity thereof. Since the potential is observed normally by means of a voltmeter showing high input impedance, no significant excessive current will flow. Therefore, the power that is consumed by an operation other than the proper switching operation is minimized. When the resistor 18 connected there shows a resistance value (e.g. not less than 1 MΩ) sufficiently higher than the channel resistance, the electric current that flows there becomes negligible.

An arrangement of determining only the polarity (positiveness or negativeness) of the potential detection electrode 17 without observing the absolute value of the potential of the potential detection electrode 17 may feasibly be employed.

As will be described in detail hereinafter, such an arrangement of using information on the polarity is very effective for controlling the operation of a circuit using such a semiconductor device 10. Thus, the potential of the potential detection electrode 17 is not necessarily be required to be accurately same as the channel potential. It is sufficient that if the semiconductor device 10 is on or off or the drain electrode 15 shows a negative potential or a positive potential can be determined. For this reason, the material of the potential detection electrode 17 may not necessarily be adapted to ohmic contact with the electron supply layer 12. In other words, the potential detection electrode 17 and the electron supply layer 12 may be adapted to Schottky contact. When the potential detection electrode 17 and the electron supply layer 12 are adapted to ohmic contact, the immediately downstream channel potential can accurately be observed. When they are adapted to Schottky contact, the electric current flowing to the potential detection electrode 17 can be minimized. In the former instance, the material of the source electrode 14 and the drain electrode 15 is also used to form the potential detection electrode 17. In the latter instance, the material of the gate electrode 16 is also used to form the potential detection electrode 17.

The electric current flowing through the potential detection electrode 17 can be reduced further by connecting a resistor 18 whose resistance value is sufficiently higher than the channel resistance in an on state, e.g., 1 MO, to the electric potential detection electrode 17. Then, the influence of measuring the potential on the channel can be further reduced.

With the technique described in Patent Document 1 (Jpn. Pat. Appln. Laid-Open Publication No. 2006-108679), an electric current detecting device is formed at a side of HEMT having an ordinary structure. To the contrary, the potential detection electrode 17 is inserted between the source electrode 14 and the gate electrode 16 of the semiconductor device 10 of this embodiment. Since the potential detection electrode 17 does not need to detect any electric current, the size of the potential detection electrode 17 can be made sufficiently smaller than that of the source electrode 14 and that of the drain electrode 15. For this reason, the required increase of area is small if compared with the technique of Patent Document 1. In other words, the chip area can be reduced significantly.

Figure 6:
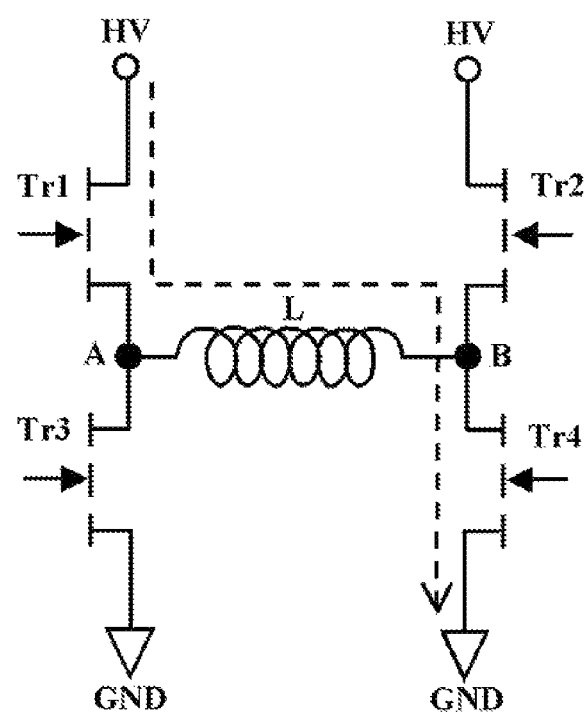
FIG. 6 is a diagram of a full bridge driver circuit circuit, illustrating an exemplar circuit configuration thereof.

When the semiconductor device 10 is employed as switching device in a motor driver circuit as shown in FIG. 6, it provides remarkable advantages as described below. Then, an operation of detecting the polarity of the channel potential by means of the potential detection electrode 17 will be particularly effective.

With the circuit of FIG. 6, when Tr1 and Tr4 are turned on and Tr2 and Tr3 are turned off, an electric current flows by way of the route indicated by an arrowed broken line. Thus, an electric current flows through motor coil L from left to right in FIG. 6. When, on the other hand, Tr1 and Tr4 are turned off and Tr2 and Tr3 are turned on, an electric current flows the other way, or from right to left through the coil L in FIG. 6. Note that, when Tr1 is turned off in a state where Tr1 and Tr4 are on and Tr2 and Tr3 are off (in a so-called dead time period), the potential at point A becomes negative relative to GND due to the counter electromotive force of the coil L. Then, the energy accumulated in the coil is discharged through Tr3. Thus, after an electric current flows through Tr3, point A becomes to show zero potential.

Figure 2:
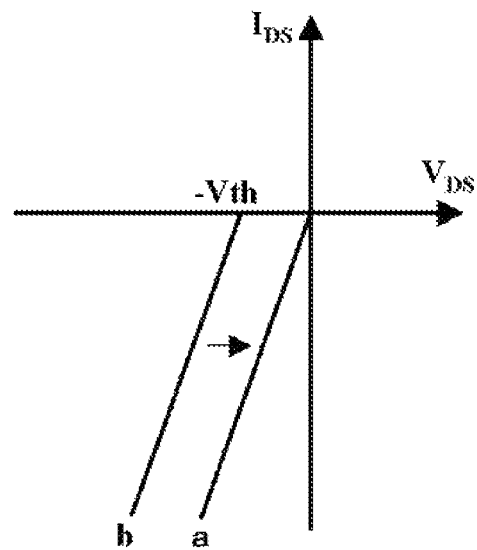
FIG. 2 is a graph illustrating the characteristic of Tr3 observed when point A shows a negative potential in a full bridge motor driver circuit.

FIG. 2 is a graph showing the relationship between drain-source voltage $V_{DS}$ and drain current $I_{DS}$ of Tr3 in the circuit of FIG. 6. The relationship between $V_{DS}$ and $I_{DS}$ in the dead time period shows characteristic b in FIG. 2 that is offset by about 1 to 3 V, which is equal to the threshold value ($V_{th}$) of Tr3, from characteristic a in FIG. 2. The power consumption increases by an amount corresponding to the offset voltage. To dissolve such a situation, the characteristic needs to be restored to characteristic a in FIG. 2 by turning on Tr3 when point A becomes to show a negative potential.

Figure 3:
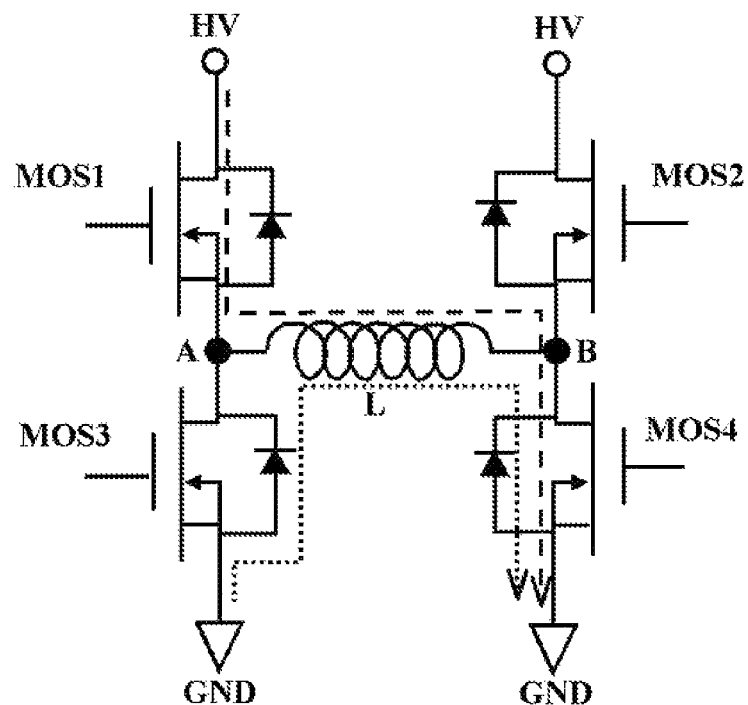
FIG. 3 is a diagram of a motor driver circuit formed by using ordinary MOSFETs, illustrating the circuit configuration thereof.

This problem arises regardless if the transistors in the circuit of FIG. 6 are ordinary MOSFETs (metal oxide semiconductor field effect transistors) or HEMTs so long as coil L is used as load. However, the problem is not serious when the transistors are ordinary MOSFETs. FIG. 3 shows a circuit diagram when the transistors of the circuit in FIG. 6 are ordinary MOSFETs, or MOS 1 through MOS 4. The situation of this case is described in, for example, Jpn. Pat. Appln. Laid-Open No. Publication 2006-115557. When the transistors are ordinary (n-channel) MOSFETs formed by using silicon, n-type drain region and source region are formed on a p-type substrate. Therefore, a diode (body diode) is automatically formed by the p-type substrate and the n-type drain region on the periphery of the drain region. In other words, there is produced an arrangement where a body diode is substantially connected between the source and the drain of each of the MOS 1 through MOS 4 as shown in FIG. 3. $V_F$ (forward voltage) of each of the body diodes is normally about 0.6 V.

In such a case, point A becomes to show a negative potential as pointed out above and when the absolute value of the voltage exceeds $V_F$, an electric current flows through the body diodes as indicated by arrowed dotted line in FIG. 3 if the MOS 3 is in an off state. Thus, if point A becomes to show a large negative potential, the negative potential is automatically dissolved by the electric current and hence no large loss arises.

To the contrary, the source region and the drain region of a HEMT formed by using a compound semiconductor show a structure as shown in FIG. 1 and no body diode is formed. Thus, while the absolute value of the offset voltage is determined by the threshold value ($V_{TH}$) of HEMT, it is about 1 to 3 V, which is higher than $V_F$ of the above-described body diodes. Additionally, when $V_{TH}$ is as low as about 1 V, for example, there may arise an instance where a negative potential (e.g., about −5 V) is applied to the gate while Tr3 is off in order to make sure that HEMT (Tr3) is reliably turned off. In such an instance, the above-described voltage fall becomes to about −6 V in total to make the loss even greater. For this reason, the above-identified problem becomes particularly remarkable in an instance where HEMTs are employed unlike an instance where MOSFETs are employed.

When the semiconductor device 10 is employed as Tr3, the potential at point A is equal to that of the drain electrode 15. When this potential becomes negative while Tr3 is off, the potential detected by the potential detection electrode 17 becomes also negative. Thus, that the potential of the drain electrode 15 becomes negative can be detected by means of the potential detection electrode 17. When that the potential of the drain electrode 15 becomes negative is detected, the state where characteristic b transitionally appears can be turned into a state where characteristic appears by controlling the gate voltage of Tr3 and turning it on. Thus, the offset voltage can be dissolved and excessive power consumption can be suppressed. When it is only required to detect that the potential at point A becomes negative, it is sufficient to recognize the sign of the potential detected by the potential detection electrode 17.

For such a purpose, the potential detection electrode 17 is particularly preferably arranged between the source electrode 14 and the gain electrode 16 as shown in FIG. 1. An on state and an off state can be detected when the potential detection electrode 17 is arranged between the gate electrode 16 and the drain electrode 15. However, because the channel potential between the gate electrode 16 and the drain electrode 15 is a high voltage close to the drain voltage (e.g., 500 V), it is difficult to detect such a high positive potential and a small negative potential at the same time. On the other hand, the channel potential there is constantly close to the source potential when the potential detection electrode 17 is arranged between the source electrode 14 and the gate electrode 16. With such an arrangement, the potential detection electrode 17 is required only to detect a small positive potential and a small negative potential so that it can operate easily and accurately to detect them.

Figure 4:
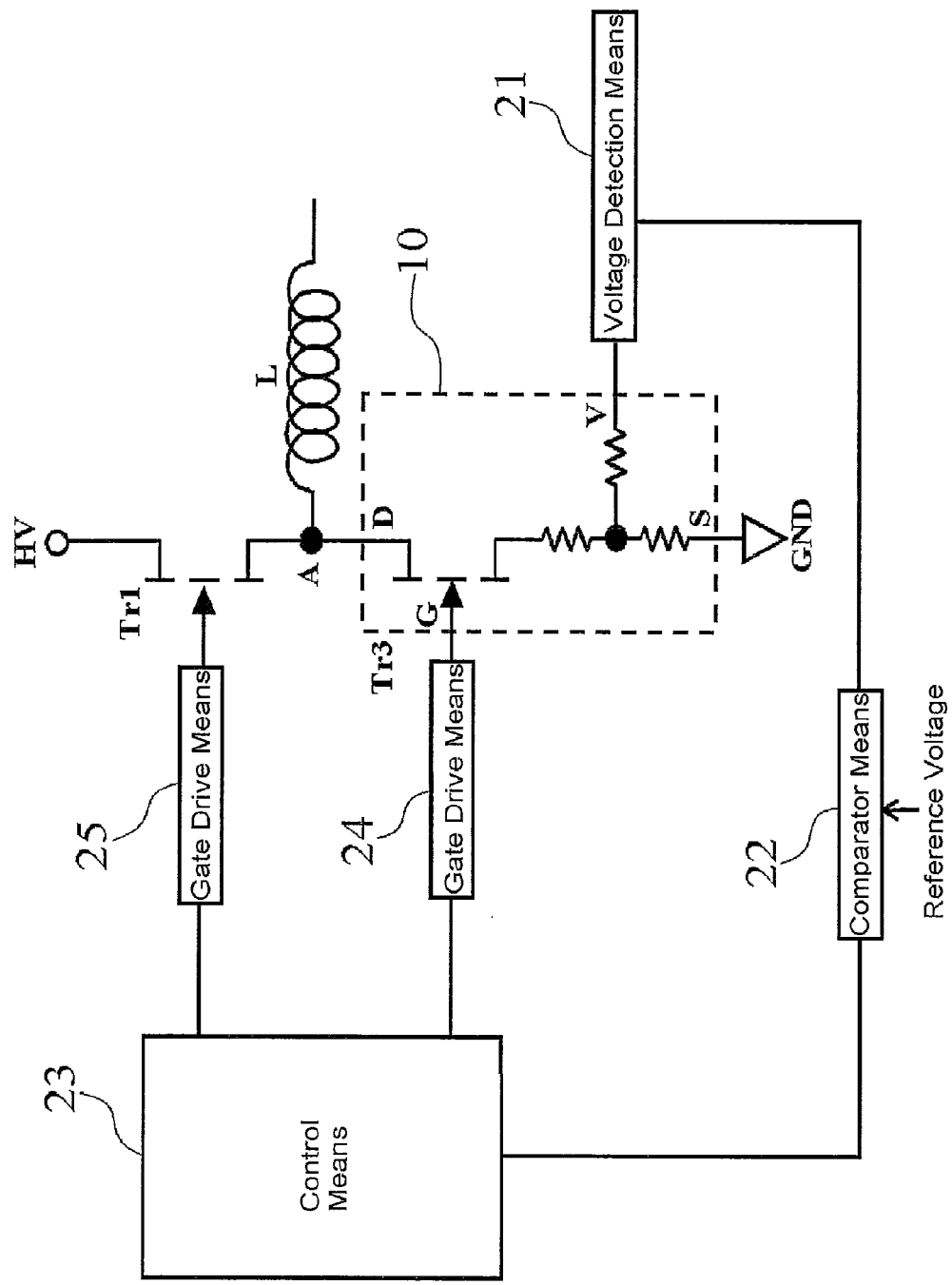
FIG. 4 is a diagram of a motor driver circuit formed by using the semiconductor device according to the embodiment of the present invention, illustrating (part of) an exemplar circuit configuration.

FIG. 4 schematically illustrates a circuit configuration for the above-described operation. Note that FIG. 4 shows a part that includes only Tr1, Tr3 and L of FIG. 6. An ordinary HEMT is employed as Tr1 at the high side, while the semiconductor device 10 is employed as Tr3 at the low side. The potential output from the potential detection electrode 17 by way of the resistor 18 is detected by the voltage detection means 21. A comparator means 22 determines the channel potential immediately downstream of the potential detection electrode 17 by comparing the detected voltage and a predetermined reference value. A control means 23 controls the gate of Tr3 (semiconductor device 10) by a gate drive means 24 and that of Tr1 by means of gate drive means 25 on the basis of the result of the determination.

An exemplar control method of the above electric circuit will be described below. When the channel potential becomes negative (and the potential at point A also becomes negative) while Tr3 is off, the comparator means 22 compares the output of the voltage detection means 21 and a reference value and, if the output is smaller than the reference value, the comparator means 22 recognizes that the output is negative. In response to this outcome, the control means 23 controls the gate drive means 24 to turn on the gate of Tr3 (semiconductor device 10) (a forced on step: 1st Step). Then, as a result, the potential at point A becomes close to nil so that the voltage detected by the voltage detection means 21 rises and also becomes close to nil. When the channel potential becomes close to nil as a result of the outcome of the determination by the comparator means 22 (or the absolute value of the electric potential falls below a predetermined value), the control means 23 controls the gate drive means 24 again to turn off the gate of Tr3 (semiconductor device 10) (forced off step: 2nd Step). For the above-described operation, the operation conducted by means of the body diodes of MOSFETs in FIG. 3 is conducted instead by means of the control means 23 and so on when HEMTs are employed. Then, Tr3 is turned off, the control means 23 can make the electric current indicated by an arrowed broken line in FIG. 6 to get to coil L (motor) by controlling the gate drive means 25 to turn on the gate of Tr1 at the high side (3rd Step). The above operation can be conducted only by means of the polarity of the potential detected by the potential detection electrode 17. If such is the case, it may be so arranged that the forced on step is executed only for a predetermined time period when a negative potential is detected.

In this way, a semiconductor device (HEMT) 10 having a high-speed operation capability and an excellent current drive capability if compared with conventional MOSFETs can be employed as transistor (switching device) at the low side of a full bridge circuit for driving motor. Then, a low power loss operation can be realized by controlling synchronous rectification and detecting the negative potential, at point A to suppress excessive power consumption. Thus, a switching circuit having a high-speed operation capability and an excellent current drive capability can be driven at a low power consumption rate.

Figure 5:
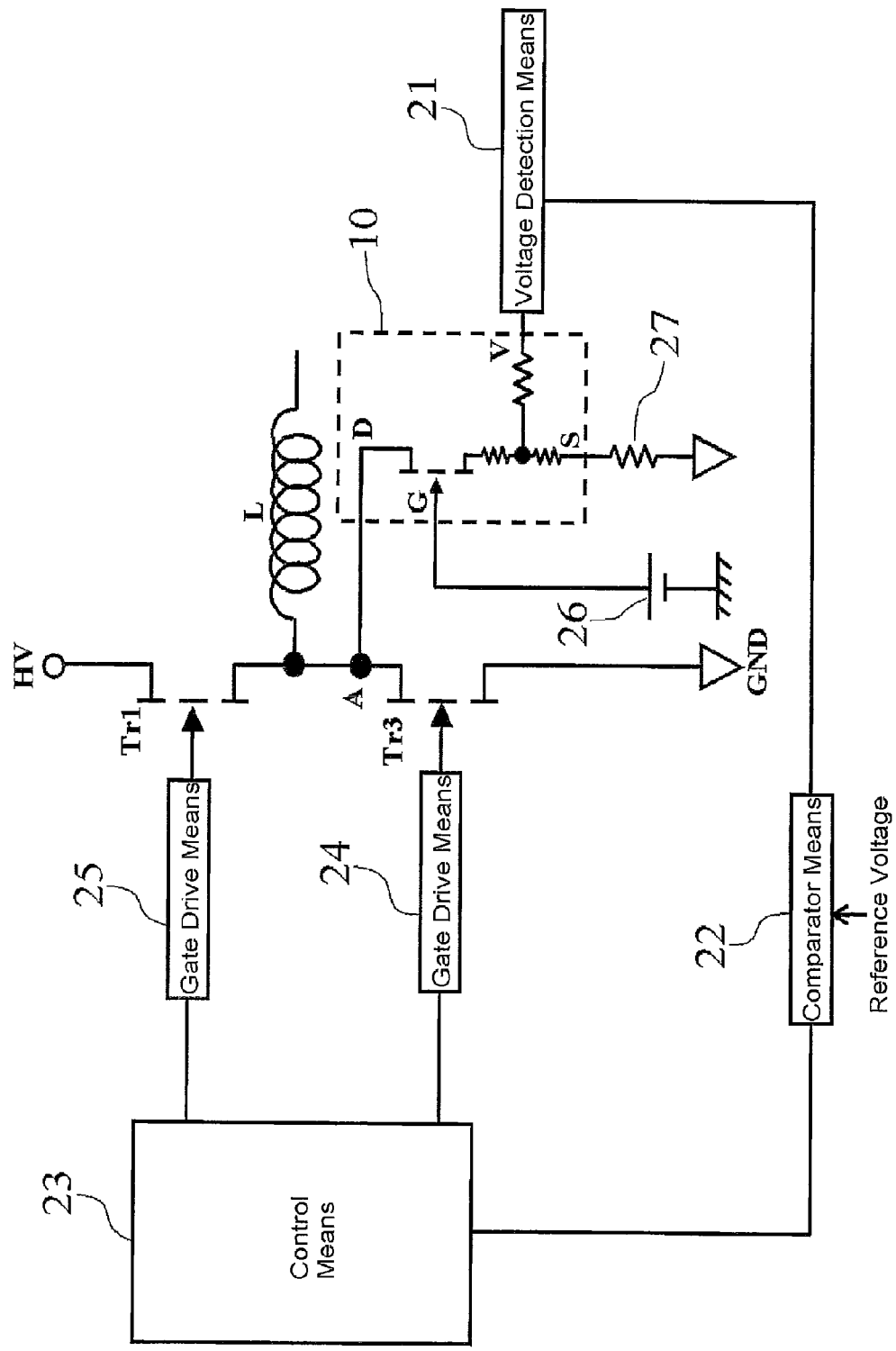
FIG. 5 is a diagram of a motor driver circuit formed by using the semiconductor device according to the embodiment of the present invention, illustrating (part of) another exemplar circuit configuration.

FIG. 5 shows another exemplar electric circuit using the semiconductor device 10. Note that, FIG. 5 shows a part related only to Tr1, Tr3 and L just like FIG. 4. An ordinary HEMT is employed as Tr1 at the high side and also an ordinary HEMT is employed as Tr3 at the low side. The semiconductor device 10 is connected to point A at the drain thereof. The voltage detection means 21, comparator means 22, control means 23 and gate control means 24 and 25 are connected to the semiconductor device 10 just like their counterparts in FIG. 4. A positive constant voltage is applied to the gate of the semiconductor device 10 from a DC current source 26 and a resistor 27 showing a high resistance value is connected to the source of the semiconductor device 10.

The semiconductor device 10 in the electric circuit of FIG. 4 takes two roles of performing switching operations and detecting the potential at point A. In the electric circuit of FIG. 5, to the contrary, Tr3, which is a conventional HENT, performs switching operations and the semiconductor device 10 operates only for detecting the potential at point A. Thus, the drain current of the semiconductor device 10 can be reduced to a negligible level when compared with Tr3 so that a downsized semiconductor device can be used for it. The drain current can be reduced further by making the resistance value of the resistor 27 sufficiently large. Then, the electric current flowing from point A to the semiconductor device 10 can also be reduced to a negligible level. An electric current lost during the potential detection can be reduced further if compared with the case of FIG. 4. Furthermore, since the Tr3 that is employed exclusively for switching operations and the semiconductor device 10 that is employed exclusively for potential detection are separated, they can be optimally designed to achieve their respective objectives. Thus, switching operations can be performed highly preferably and the potential detection capability can be enhanced to make it possible to appropriately control synchronous rectification and suppress excessive power consumption for a low power loss operation.

While nitride semiconductors of GaN and AlGaN are typically employed for the channel layer and the electron supply layer of the semiconductor device, a semiconductor device designed to use two-dimensional electron gas provides advantages similar to the above-described ones. In other words, the present invention is applicable for materials other than the above described ones. More particularly, $Al_xM_yGa_{1-x-y}N$ ($0 \leq x \leq 1$, $0 \leq y \leq 1$, $0 \leq x+y < 1$, where M contains at least either In or B) that contains indium (In) and/or boron (B) as IIIB group elements same as Ga and Al may be used as nitride semiconductor.

While the electric circuit where the semiconductor device is employed is described above in terms of full bridge circuit for driving a motor, the above-described control method is also effective for the electric circuit where the voltage at the drain side can transitionally become negative. In other words, it is clear that the semiconductor device and the method of controlling an electric circuit that are described above are also effective for applications other the above-described ones. It is clear that the semiconductor device and the method of controlling an electric circuit that are described above are also effective for electric circuits having one or more than one arms because problems similar to the above-described one can take place there.

What is claimed is:

1. A semiconductor device which includes a first semiconductor layer, a second semiconductor layer formed on the first semiconductor layer and a source electrode, a drain electrode and a gate electrode formed on the second semiconductor layer, and in which electrons flow between the source electrode and the drain electrode by way of a two-dimensional electron gas layer at a hetero junction interface of the first semiconductor layer and the second semiconductor layer and a channel where the electrons flow is controlled for on and off by a voltage applied to the gate electrode, wherein
   a potential detection electrode detecting a channel potential between the source electrode and the gate electrode, or detecting a polarity of the channel potential, without interrupting formation of the channel, is formed on the second semiconductor layer on the channel between the source electrode and the gate electrode,
   an area of the second semiconductor layer which the potential detection electrode contacts, is smaller than another area which the source electrode contacts, and is smaller than another area which the drain electrode contacts,
   and a resistor with a resistance value of not less than 1 MΩ is connected to the potential detection electrode.

2. The semiconductor device according to claim 1, wherein the potential detection electrode is formed by a material adapted to ohmic contact with the second semiconductor layer.

3. The semiconductor device according to claim 1, wherein the potential detection electrode is formed by a material adapted to Schottky contact with the second semiconductor layer.

4. The semiconductor device according to claim 1, wherein the first semiconductor layer and the second semiconductor layer are formed respectively by nitride semiconductors.

5. An electric circuit which includes more than one arms, each being formed by connecting two switching devices in series between the high side terminal and the low side terminal thereof, and in which the opposite terminals of a coil are connected to the connection points of the two switching devices of the arms, wherein
   a semiconductor device according to claim 1 is employed as at least the switching device arranged at the low side.

6. An electric circuit which includes more than one arms, each being formed by connecting two switching devices in series between the high side terminal and the low side terminal thereof, and in which the opposite terminals of a coil are connected to the connection points of the switching devices of the arms, wherein
   a semiconductor device according to claim 1 is arranged in each of the arms with the drain electrode of the semiconductor device connected to the connection point.

7. A method of controlling an electric circuit having a semiconductor device according to claim 1, comprising a first step of controlling a voltage applied to the gate electrode to turn on the semiconductor device when the potential detected by the potential detection electrode is negative.

8. The method of controlling an electric circuit according to claim 7, further comprising a second step of turning off the semiconductor device after the first step when the absolute value of the potential detected by the potential detection electrode becomes smaller than a predetermined value.

* * * * *